United States Patent
Vaculik et al.

(10) Patent No.: US 12,294,316 B2
(45) Date of Patent: May 6, 2025

(54) CONTROLLER FOR A POWER CONVERTER AND A METHOD OF CONTROLLING A POWER CONVERTER

(71) Applicant: NXP USA, Inc., Austin, TX (US)

(72) Inventors: Lukas Vaculik, Valasske Mezirici (CZ); Radek Holis, Karolinka (CZ); Ivan Sieklik, Slovakia (SK)

(73) Assignee: NXP USA, Inc., Austin, TX (US)

( * ) Notice: Subject to any disclaimer, the term of this patent is extended or adjusted under 35 U.S.C. 154(b) by 250 days.

(21) Appl. No.: 18/193,919

(22) Filed: Mar. 31, 2023

(65) Prior Publication Data

US 2024/0333177 A1    Oct. 3, 2024

(30) Foreign Application Priority Data

Mar. 23, 2022    (EP) .................................... 22163791

(51) Int. Cl.
  *H02M 7/5387* (2007.01)
  *H02M 1/00* (2006.01)
(52) U.S. Cl.
  CPC ..... *H02M 7/53871* (2013.01); *H02M 1/0003* (2021.05)
(58) Field of Classification Search
  CPC ........... H02M 7/53871; H02M 1/0003; H02M 1/0032; H02M 3/01; H02M 7/53873; H03K 7/06; H03K 7/08
  See application file for complete search history.

(56) References Cited

U.S. PATENT DOCUMENTS

| | | | | |
|---|---|---|---|---|
| 4,611,320 A | * | 9/1986 | Southard | H04M 3/244 370/241 |
| 6,975,679 B2 | * | 12/2005 | Bowling | G06F 1/025 326/38 |
| 7,002,818 B2 | * | 2/2006 | Hamilton | H02M 3/33592 363/127 |
| 11,108,324 B1 | * | 8/2021 | Vaculik | H02P 7/29 |

(Continued)

FOREIGN PATENT DOCUMENTS

EP    3125417 A1    2/2017

OTHER PUBLICATIONS

NXP Semiconductor: "Class D Audio Amplifier Reference Design," website: https://www.nxp.com/design/designs/class-d-audio-amplifier-reference-design:CLASS-D-AUDIO-AMPLIFIER#0, pp. 1-5.

*Primary Examiner* — Yusef A Ahmed (57) ABSTRACT

A controller for a power converter includes a generator module which generates a sequence of pulses each having a width defined by a rise moment and fall moment stored in respective RM and FM registers. The sequence of pulses have a repetition rate that is modulated by a repetition period value stored in a RP register. A memory of the controller has tables of rise moment values, fall moment values and repetition period values configured to be written into the RM, FM and RP registers respectively. A direct memory access (DMA) module of the controller is configured to write rise moment, fall moment, and repetition period values from the respective memory table into the RM, FM, and RP registers respectively, in response to a DMA trigger. A core coupled to the DMA module is configured to write the rise moment, fall moment, and repetition period values into the memory tables.

16 Claims, 8 Drawing Sheets

(56) References Cited

U.S. PATENT DOCUMENTS

| | | | |
|---|---|---|---|
| 11,509,171 B2 * | 11/2022 | Vaculik | H02J 50/12 |
| 11,595,027 B2 * | 2/2023 | Rohleder | H03K 19/20 |
| 2002/0184469 A1 * | 12/2002 | Bowling | H03K 7/08 |
| | | | 712/1 |
| 2009/0184742 A1 * | 7/2009 | Kris | H03K 7/08 |
| | | | 327/160 |
| 2009/0292936 A1 * | 11/2009 | Hayakawa | G06F 1/025 |
| | | | 713/330 |
| 2012/0102354 A1 * | 4/2012 | Takata | G06F 1/06 |
| | | | 713/501 |
| 2012/0154005 A1 * | 6/2012 | Frederiksen | H03K 7/08 |
| | | | 327/175 |
| 2013/0015798 A1 * | 1/2013 | Wright | H03K 7/08 |
| | | | 323/241 |
| 2013/0057330 A1 * | 3/2013 | Steedman | H03K 7/08 |
| | | | 327/293 |
| 2013/0147552 A1 * | 6/2013 | Hsu | H03F 3/2171 |
| | | | 330/251 |
| 2014/0207979 A1 * | 7/2014 | Wu | G06F 13/28 |
| | | | 710/22 |
| 2015/0145574 A1 * | 5/2015 | Fujiwara | H05B 45/3725 |
| | | | 327/175 |
| 2017/0077712 A1 * | 3/2017 | Sugisawa | H02J 4/00 |
| 2019/0103771 A1 * | 4/2019 | Piasecki | H04B 5/72 |
| 2021/0153919 A1 | 5/2021 | Schumacher et al. | |
| 2021/0184596 A1 * | 6/2021 | Frampton | H02M 7/4803 |
| 2022/0123591 A1 * | 4/2022 | Vaculik | H02J 50/12 |
| 2022/0140738 A1 * | 5/2022 | Lin | H02M 3/33584 |
| | | | 363/17 |
| 2023/0283218 A1 * | 9/2023 | Deng | H02P 27/085 |
| | | | 318/400.14 |

* cited by examiner

CONTROLLER FOR A POWER CONVERTER AND A METHOD OF CONTROLLING A POWER CONVERTER

CROSS-REFERENCE TO RELATED APPLICATIONS

This application claims the priority under 35 U.S.C. § 119 of European Patent application no. 22163791.1, filed on 23 Mar. 2022, the contents of which are incorporated by reference herein.

FIELD

The present disclosure relates to controllers for power converters and methods of controlling the same.

BACKGROUND

Pulse width modulation (PWM) signals are used as inputs to control a power converter. A conventional PWM signal has a sequence of pulses, usually with a consistent amplitude and a fixed frequency. The width of each pulse is modulated to vary the duty cycle or ON time of the pulse. When this modulated digital output is applied to a power converter an analog waveform is produced. Power converter outputs have been used to power electric motors, charge batteries, drive illumination sources and for many other types of loads. The power converter and its connected power source can be designed to suit the demands of different loads while the PWM signal serves only as a low power digital control input. When the PWM signal has a higher duty cycle, then the power converter produces a higher power output, so by increasing or decreasing the widths of the pulses, the resulting power amplitude can be increased or decreased to suit different loads. In many applications, a periodically varying output (such as a sinusoidal output), is desirable or required. An example of such an application is an AC signal on a supply side of a wireless power transfer device, in which the AC signal is applied to an inductive component on the primary side to generate a varying field, from which power is harvested on the secondary side, using the mutual inductance of an inductors on the primary and secondary side. PWM signals for such applications may be referred to as sinusoidal PWM, or SPWM.

As mentioned above, conventional PWM signals typically have a constant frequency, or repetition rate.

SUMMARY

According to a first aspect of the present disclosure, there is provided controller for a power converter, the controller comprising: a generator module configured to generate a sequence of pulses each having a width that is defined by a rise moment value, R, stored in a RM register of the generator module and a fall moment value, F, stored in a FM register of the generator module, the sequence of pulses having a repetition rate T that is modulated by a repetition period, RP, value stored in a RP register of the generator module; a memory having a table of R values, a table of F value and a table of RP values configured to be written into the generator module RM register, the generator module FM register and the generator module TM register respectively; and a direct memory access, DMA, module coupled to the generator module and to the memory table and configured to write a R value, a F value and a RP value from the respective memory table into the RM register, the FM register and the RP register respectively, in response to a DMA trigger. A controller so configured may be capable of providing flexible PWM, PFM or a hybrid combination ("PWFM") control for a power converter for instance.

The controller may further comprise a core coupled to the DMA module and configured to write the R, F and RP values into the memory table.

Thereby it may be possible to generate PWM signals, for which the reputation rate or frequency may also vary or be modulated. Such a hybrid pulse width and frequency width modulated signal may be described hereinafter as a PWFM signal.

According to one or more embodiments the generator module is configured to send the DMA trigger to the DMA module after generating each pulse. Direct memory access may be conveniently used to ensure rapid transfer of data, thereby enabling a relatively fast (for instance 2 MHz or above) clock to be used, and to save Core resources, since DMA periphery data transfer typically is autonomous once configured and started.

According to one or more embodiments the memory table has a sequentially ordered plurality of RP values, and the DMA module is configured to write the RP values from the memory table into the RP register in the sequential order in response to each DMA trigger. In one or more embodiments, the DMA module is configured to write the first R value in the sequence after writing the last R value in the sequence. The DMA module may thus operate a circular loop look-up from the memory, requiring only a finite number of rows in the memory table.

According to one or more embodiments the generator module is configured to generate at least two different sequences of pulses to drive two inputs of a power converter, the generator module having a first register for the first of the at least two sequences and a second register for the second of the at least two sequences, wherein the DMA module has a first channel for the first register and a second channel for the second register, and wherein the DMA module is configured to write from the first channel to the first register in response to a first channel trigger from the generator module and to write from the second channel to the second register in response to the second channel trigger from the generator module. Many applications of the controller may require separate control of two channels for instance in order to control a full bridge power converter.

In one or more embodiments the controller further comprises an input signal interface coupled to the core configured to receive an input signal and wherein the core is configured to modify the R, F, and RP values in response to the input signal and to write the modified R, F and RP values into the memory. The core may configured to modify the R, F, and RP values by selecting a stored set of different R, F, and RP values in response to the input signal. The output of, for instance, a power converter connected to the controller may therefore be varied.

According to one or more embodiments the core is configured to modify the R, F, and RP values by incrementing and decrementing at least one of the R, F, and RP values in response to the input signal. By appropriately incrementing RM or decrementing FM, pulses may be shortened which may reduce the power output of a power converter connected to the controller. Conversely by decrementing R or incrementing F, pulses may be lengthened which may increase the power output of the power converter connected to the controller. Reducing the value of RP may increase the frequency of the modulation.

According to one or more embodiments the input signal is provided by a closed feedback loop from a power output of a power converter. According to one or more other embodiments the input signal is a power output command from an external component.

According to a second aspect of the present disclosure there is provided a method of controlling a power converter, the method comprising: generating, in a generator module, a sequence of pulses each having a width that is defined by a rise moment value, R, stored in a RM register of the generator module and a fall moment value, F, stored in a FM register of the generator module, the sequence of pulses having a repetition rate T that is modulated by a repetition period, RP, value stored in a TM register of the generator module; writing, from a memory having a table of R values, a table of F values and a table of RP values, R values, F values and RP values into the generator module RM register, the generator module FM register and the generator module TM register respectively; and writing, by means of a direct memory access, DMA, module coupled to the generator module and to a memory and configured to write a R value, a F value and a RP value from a respective memory table into the RM register, the FM register and the RP register respectively, in response to a DMA trigger, wherein the memory has a table of R values, a table of F value and a table of RP values configured to be written into the generator module RM register, the generator module FM register and the generator module TM register respectively. Accordingly, according to this aspect, the method may by run without intervention from a core processor, and thereby not impose a significant utilisation of core processor resources. It will be appreciated that the core processor, such as an MCU, may thereby be able to have other processes running, without being impeded.

In one or more embodiments, the method further comprises writing the R, F and RP values into the memory table from a core coupled to the DMA module. This may enable initial values to be supplied, or control in case, for instance, the power requirement changes In one or more embodiments the generator module sends the DMA trigger to the DMA module after generating each pulse.

In one or more embodiments the memory table has a sequentially ordered plurality of RP values, and wherein the DMA module writes the RP values from the memory table into the TM register in the sequential order in response to each DMA trigger. The DMA module may write the first RP value in the sequence after writing the last RP value in the sequence.

According to one or more embodiments, the method further comprises receiving an input signal and wherein the core is configured to modify the R, F, and RP values in response to the input signal and to write the modified R, F and RP values into the memory.

According to one or more embodiments, the core modifies the R, F, and RP values by selecting a stored set of different R, F, and RP values in response to the input signal. In one or more embodiments, the core modifies the R, F, and RP values by incrementing and decrementing at least one of the R, F, and RP values in response to the input signal.

One or more embodiments include providing the input signal from a closed feedback loop from a power output of a power converter. In one or more embodiments the input signal is a power output command from an external component.

There may be provided a computer program, which when run on a computer, causes the computer to configure any apparatus, including a circuit, controller, sensor, filter, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software implementation may be an assembly program.

The computer program may be provided on a computer readable medium, which may be a physical computer readable medium, such as a disc or a memory device, or may be embodied as another non-transient signal.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

Figure 1:
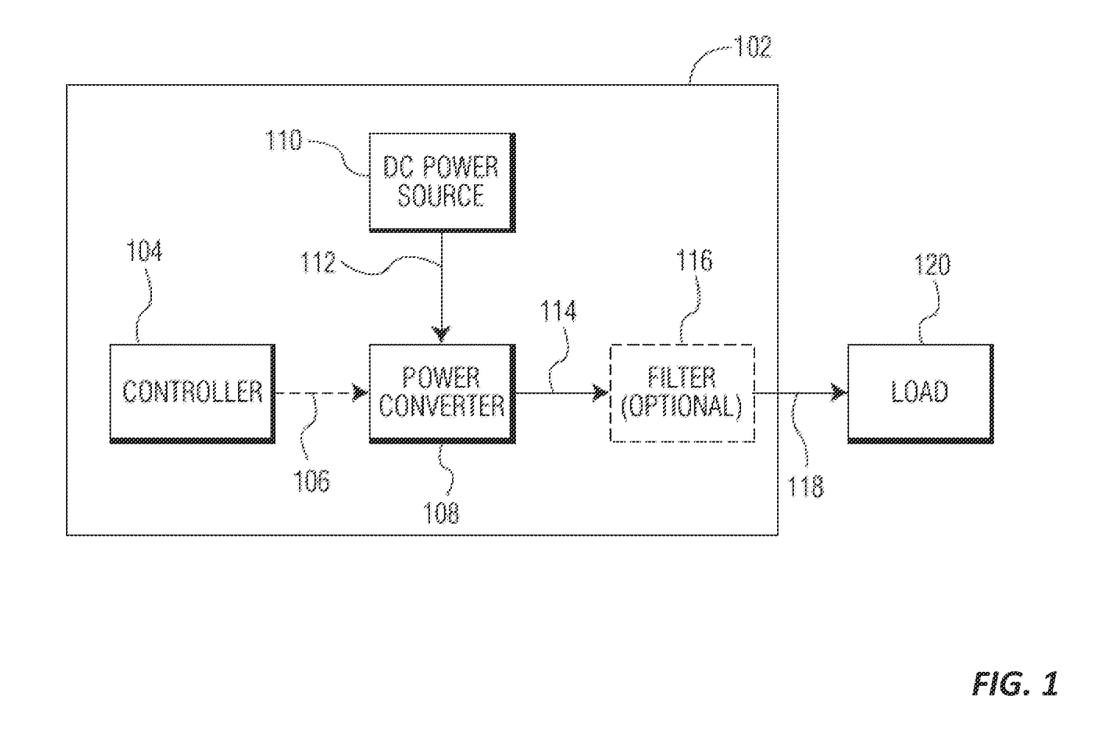
FIG. 1 depicts an example of a power generation system and a load.

FIG. 1 depicts an example of a power generation system 102 and a load 120. The power generation system provides power to drive the load 120. The power generation system includes a controller 104 coupled to a power converter 108. The power converter 108 is coupled to a DC (Direct Current) power source 110 and to the load 120. The controller 104 sends a pulse width modulation (PWM) digital signal 106 to the power converter 108 to control a power output 114 of the power converter 108. The DC power source 110 provides power 112 to the power converter 108. The power converter applies the PWM signal 106 from the controller 104 to the received power 112 to generate a modulated analog power output 114. In some embodiments, the power output is an AC (Alternating Current) waveform and is applied to the load 120 though an optional filter 116 to smooth the analog power output. In other non-limiting embodiments, the power output may be pulsed but have a single polarity. The resulting filtered power 118 from the power generation system 102 is applied to drive the load 120.

The power source 110 and the power converter 108 may be designed for any particular load including inductive battery chargers, electric motors of any kind, audio voice coils, illumination systems, digital circuitry and electronic components, and power distribution systems. Because the digital PWM signal is used only as a control input, it may be applied to multiple power converters simultaneously and the signal may be inverted to feed multiple inputs of a single power converter. Such inversion, where required, may be done within the controller, or in other embodiments, may be done externally, for instance within the power converter.

The power converter 108 may take different forms depending on the nature of the load 120, such as a Class-D converter, push-pull converter, half-bridge converter, full-bridge converter or another form. The PWM signal output 106 of the controller 104 is configured to provide an output suited to the particular type of converter.

Figure 2:
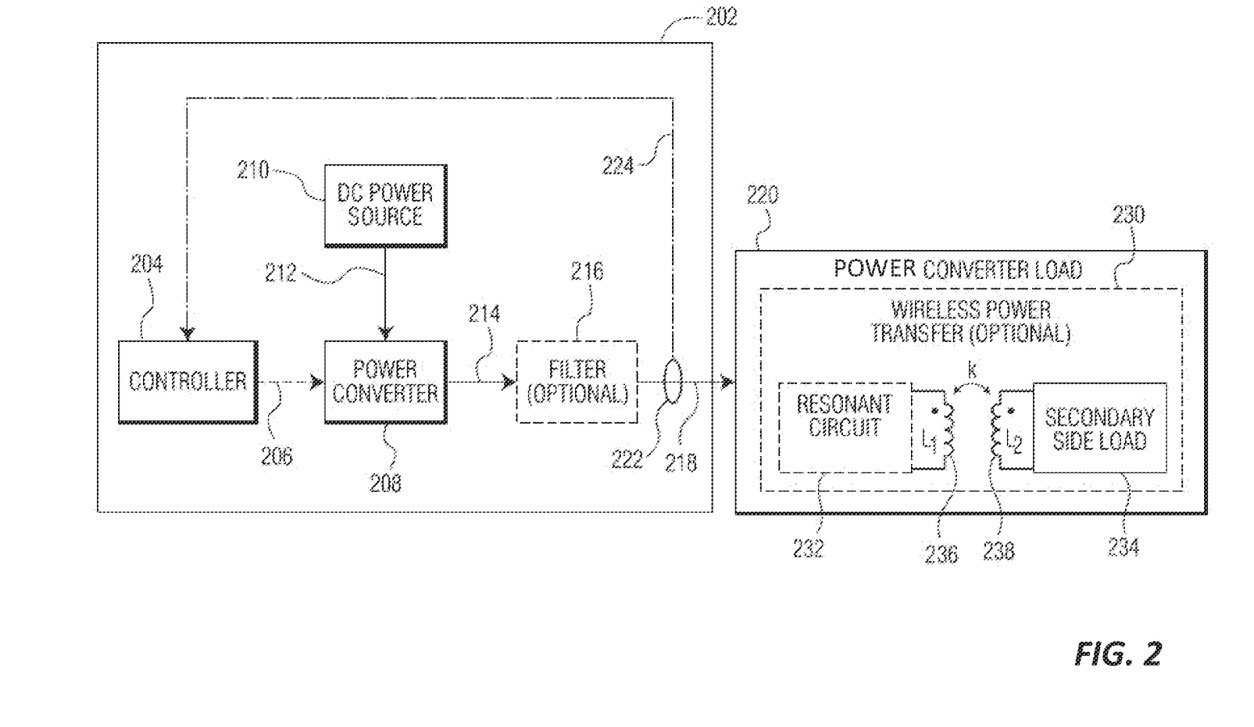
FIG. 2 depicts an alternative example of a power generation system and a load for wireless charging.

FIG. 2 depicts another example of a power generation system 202 and a load that is configured for wireless charging. In some embodiments, a power converter load 220 includes a wireless power transfer system 230, typically with a resonant circuit 232 coupled through a primary coil 236 to a secondary side load 234 coupled to the resonant circuit 232 primary coil through a secondary coil 238. The resonant circuit drives the power through the coils matching the characteristics of the load. In some embodiments, the secondary side load 234 represents a battery and the resonant circuit represents a wireless charging pad or plate. Such a configuration is suitable for charging small batteries for wireless communications devices, larger batteries for tools, and still larger batteries for vehicles. Any of a variety of different charging scenarios may be accommodated, by appropriate modification of the DC power source 210 and the power converter 208.

In this example, a controller 204 is connected to a power converter 208 to provide a PWM signal, or a PWFM (pulse width and frequency modulated signal) 206 to the power converter 208. The power converter 208 is configured to drive the resonant circuit and may produce an AC output. It may, for instance, be a full or half-bridge power converter that generates a power output 214 by modulating input power 212 from a connected DC power source 210. An AC power output 214 from the power converter may optionally be processed through a filter 216 to generate the final filtered AC power output 218 supplied to the power converter load 220.

In some embodiments, a sensor 222, such as an inductive loop current sensor, is electrically coupled to the filtered AC power supply output 218. An output 224 from the sensor is provided to the controller 204 to allow the controller to adjust the PWFM signal 206 in response to the sensed current. The sensor output 224, in this case a closed loop feedback signal, may be used to regulate the form of the PWM or PWFM signal. In some embodiments, a battery load will present varying amounts of resistance as the battery charges. By measuring the current through the sensor, the controller may be configured to reduce the supplied current as the battery becomes more fully charged. This may be done by decrementing the value of a fall moment (F) or incrementing one or both of a rise moment (R) and Repetition period (RP) in stored sets of R, F, and RP values as the resistance increases. Similarly, the core may increment the F value, or decrement one or both of the R and RP values if the resistance decreases. By incrementing and decrementing the PWFM values, an appropriate power is supplied to the power converter load 220.

In other embodiments, the controller 204 is connected to different or additional sensor inputs or to external components (not shown) such as an actuator, or some other control device and is programmed to determine an appropriate PWFM signal based on that input. In some embodiments, the controller 104 receives an input sensor signal from the load 120 that is applied by the controller to regulate the duty cycle, and/or the frequency of the PWFM power output 114. In some embodiments, the controller receives a command or control signal from an external component to determine the nature of the power output that is to be generated. In some embodiments, the command is an ON or OFF signal and the controller provides a constant output PWFM signal. The command may optionally further indicate a particular power output level to be applied. The power 214 applied to the load may be constant or varied as determined by the PWFM signal 206 from the controller 204. In some embodiments, the controller includes a host (not shown), which may include, for example, a software application that is stored in memory of the controller and executed by processing circuits of the controller. The controller may be of a generic type known in the field, but uniquely configured for the described implementation. The controller may be implemented as, for example, digital signal processors (DSPs), digital signal controllers (DSCs) and/or central processing units (CPUs).

Figure 3:
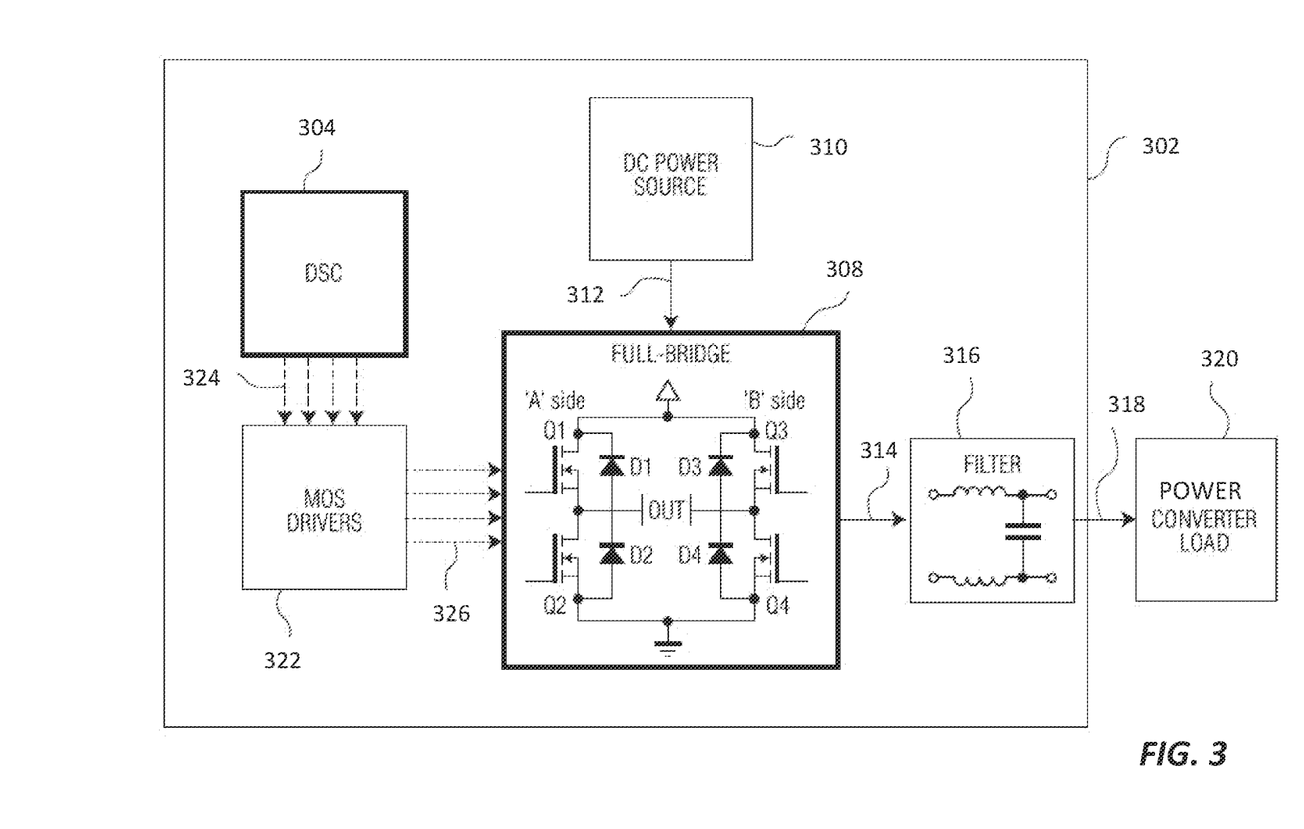
FIG. 3 depicts a further alternative example of a power generations system and a load.

FIG. 3 depicts an implementation of a power generation system 302 and a load 320. In this embodiment, a DSC (Digital Signal Controller) 304 is configured to generate four PWFM signals 324 Q1, Q2, Q3, and Q4 signals. The PWFM signals are applied to MOSFET (Metal Oxide Semiconductor Field Effect Transistor) based drivers 322 that are coupled to the DSC. The internal circuitry of the controller is primarily optimized for minimum power and minimum current in order to reduce the power consumption of the digital circuitry. The MOS drivers 322 may be configured as a line stage or a power amplifier to generate stable high current drive signals 326 to a connected full bridge power converter 308. There may be an external current supply (not shown) connected to the MOS drivers to supply the current.

The power converter receives DC power 312 from a connected source 310 and applies the PWFM drive signals 326 to the four inputs of a full bridge power converter 308 to produce a rough sine wave or other output power signal 314. This signal is filtered in an inductive-capacitive power filter 316 or any other type of filter between the full bridge power converter 308 and a load 320 to provide a filtered power output 318 to the load 320. The DSC may vary the PWM according to any particular internal programming or external command or sensor input or a combination of these types of control inputs.

Figure 4A:
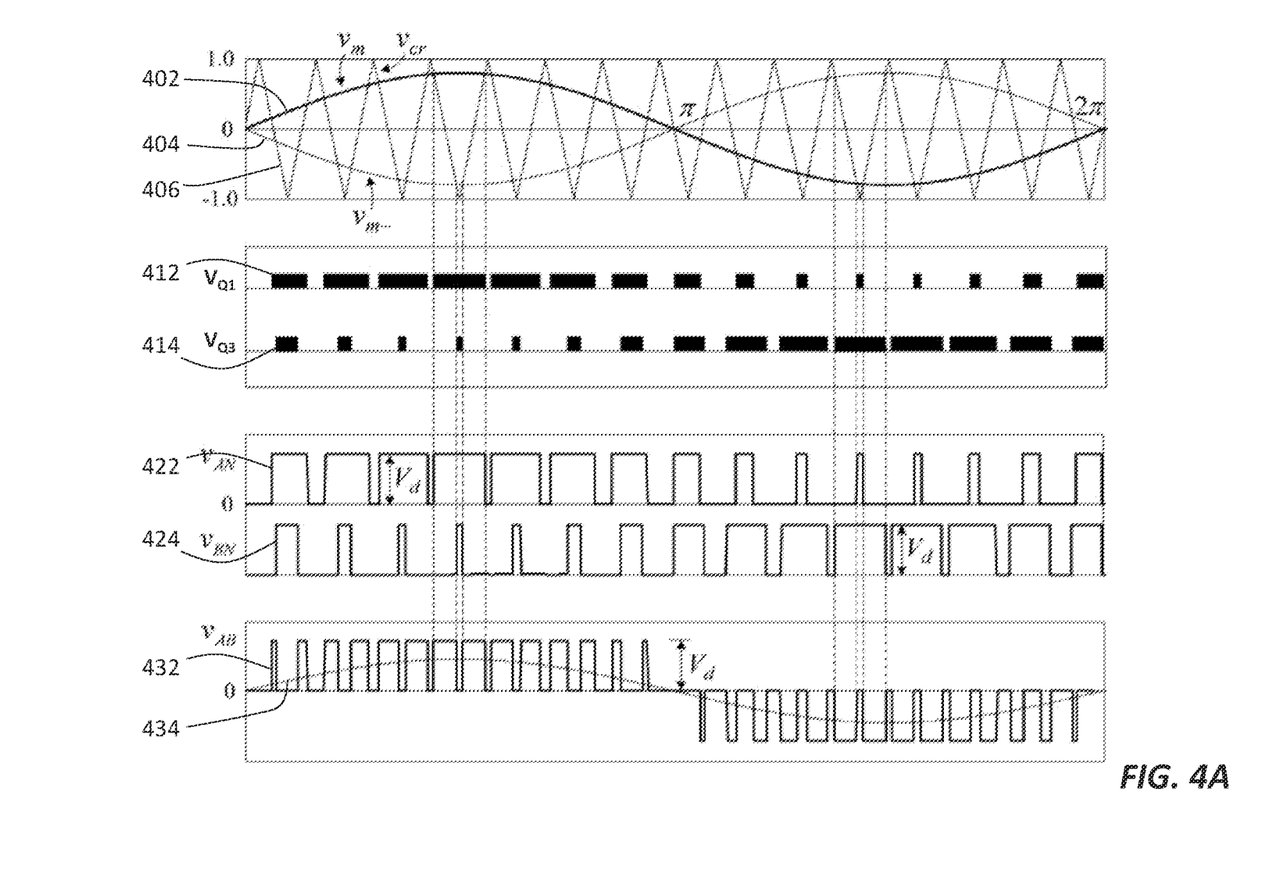
FIG. 4A illustrates an example unipolar modulated sinusoidal PWM sequence generated by a controller.

FIG. 4A illustrates an example unipolar modulated sinusoidal PWM sequence generated by a controller. The uppermost curve shows a sinusoidally signal having a voltage Vm 402 along with its inverse Vm-404. Superimposed on the signal is a triangular waveform Vcr 406. The intersections between the triangular waveform Vcr 406 and the sinusoidally signal may be used to determine the required pulse widths of a, in this case constant frequency, PWM signal required to generate a sinusoidal output. At 412 is shown the voltage on the gate of MOSFET Q1 on the 'A' side of the full bridge converter 308, and a 414 is shown the voltage on the gate of MOSFET Q3 on the 'B' side of the full bridge converter. The voltages on the gates of Q2 and Q4 are set to be the inverses of those on Q1 and Q3 respectively, that is to say: Q2=INVERT (Q1) and Q4=INVERT(Q3) which results in the voltages at the full bridge converter output nodes VAN 422 and VBN 424 as shown. This results in a voltage across the full bridge converter VAB 432 as shown on the lowest plot. Smoothed by an appropriate filter, such as that shown at 318 in FIG. 3, this results in the replicated sinusoidal output waveform shown at 434. The modulation scheme of the full bridge converter shown at FIG. 4A may be described as a unipolar modulation scheme since the output voltage VAB 432 varies only between 0 and positive during the first (positive-going) half-cycle, and varies only between negative and 0 during the second (negative-going) half-cycle of the sinusoidal waveform. The desired sinusoidal waveform may alternatively be generated by a bipolar modulation scheme in which VAB 432 varies between a positive and negative value across the complete 360° cycle of the sinusoidal waveform. According to this modulation scheme, the voltages at Q1 and Q3 are compliments of each other, so as to provide positive-to-negative and negative-to-positive swings on VAB at.

Figure 4B:
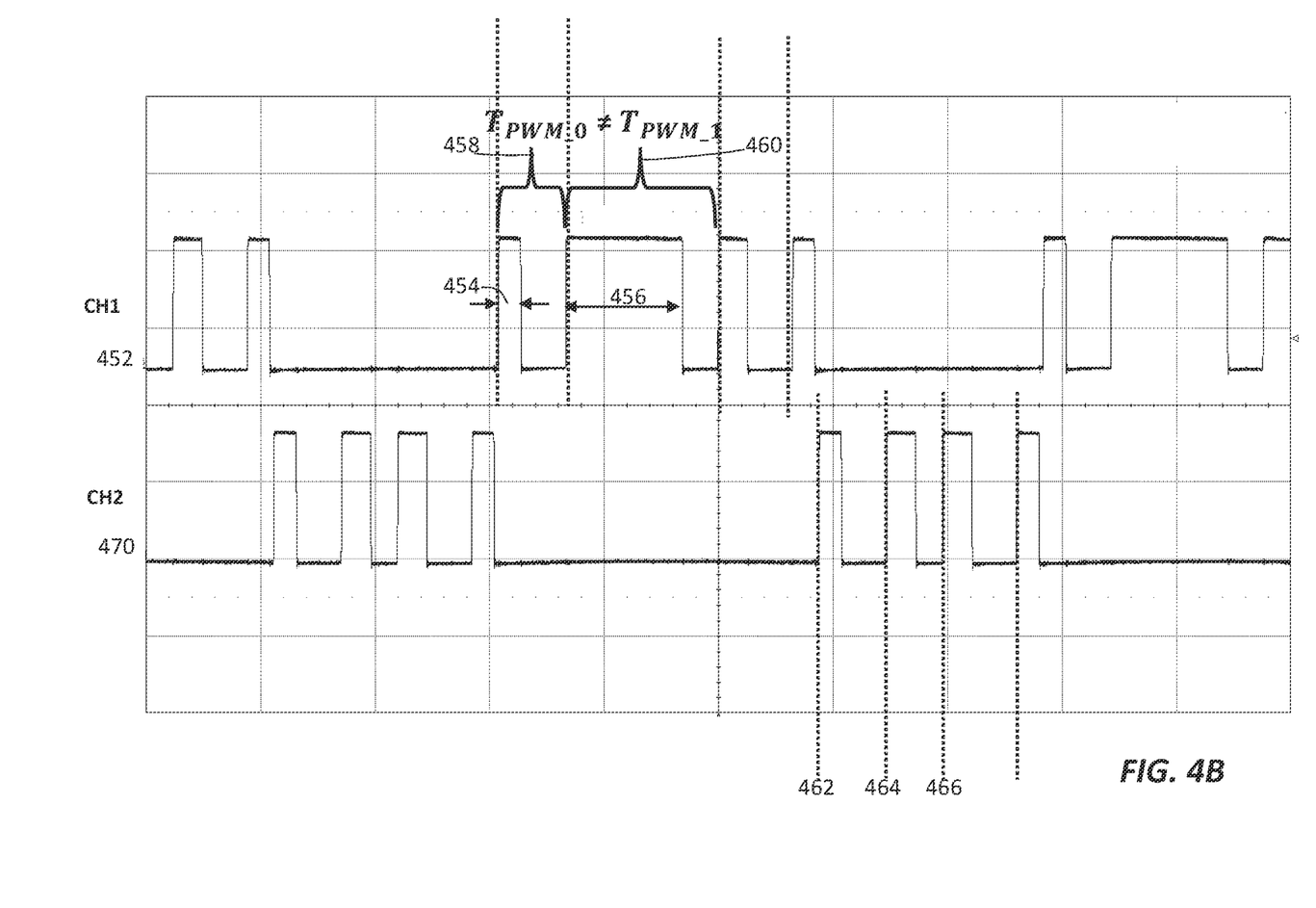
FIG. 4B shows details of a modulated pulse sequence generated by a controller, according to one or more embodiments.

FIG. 4B shows details of a modulated pulse sequence generated by a controller, according to one or more embodiments. As mentioned above, the unipolar modulation scheme showed in FIG. 4A utilises PWM modulation for which the repetition period or frequency of the modulation is fixed. According to embodiments of the present disclosure, however the pulse frequency, in addition to the pulse width, may be varied to provide pulse width and frequency modulation, PWFM. This additional freight degree of freedom may be applied both the unipolar and bipolar modulation schemes.

The figure shows a series of pulses for a first channel, CH1 out, 452, and another series of pulses for a second channel, CH2 470. As can be seen for instance at 454 and 456, the pulses within a channel may have varying widths, and thus may be considered to be modulated with a form of PWM (pulse width modulation). Moreover, the repetition rate of the pulses may also vary such that that consecutive periods TPWM_1 and TPWM_2 need not be equal, as shown for instance at 458 and 460. The pulses may thus be considered to be modulated with a form of PFM (pulse frequency modulation). Herein, this combination of two degrees of freedom (both pulse width, and repetition rate), will be described as PWFM. The skilled person will appreciate that the additional degree of freedom provided by PWFM, in comparison with either PWM or PFM control, enables increased flexibility in the design of the pulses in order to achieve the required control for the power converter.

As shown in the figure, the start of each "pulse period" may be considered, as shown by times 462, 464, 466 on so on, to be the moment of the rising edge of the pulse. However, by separately defining both a rise moment R and a fall moment F, in addition to the repetition period RT, this constraint—that is to say the rising edge of the pulse defines the start of the period—may be relaxed, as will be discussed in more detail with respect to FIG. 7 below. Furthermore, by separately defining a rise moment R and a fall moment F for each channel, with a common repetition period RP, the position—or even the existence—of a pulse in any individual period for each channel may be separately defined. For example, the example shown in FIG. 4B, may correspond to unipolar sinusoidal PWM modulation. In this example the second channel is maintained "off" while the first channel is modulated, and the first channel is maintained "off" while second channel is modulated.

Figure 5:
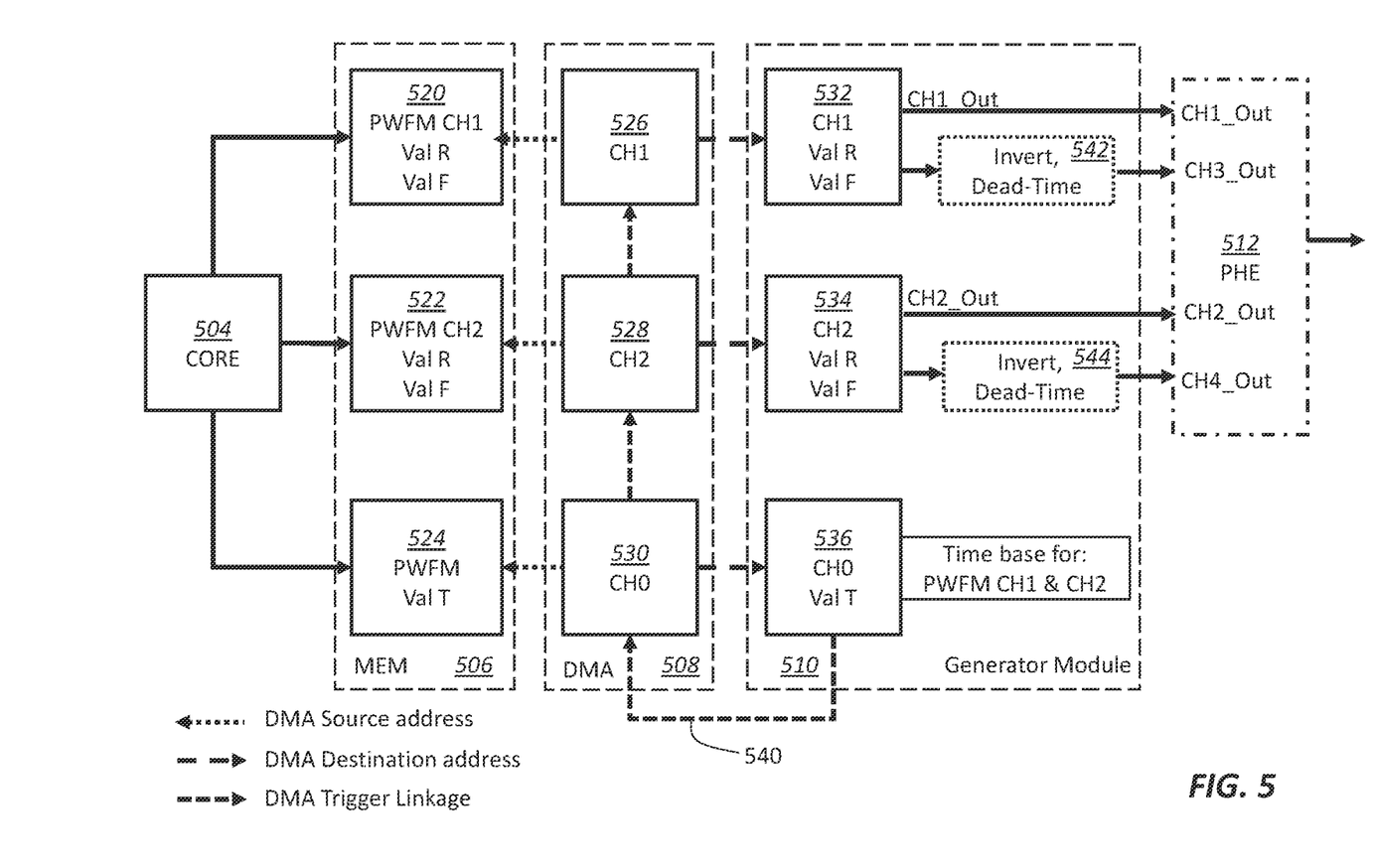
FIG. 5 depicts an example of power generation system components, interconnections and outputs within a controller for generating a PWFM pulse sequence, according to one or more embodiments.

FIG. 5 illustrates a two-channel variable duty cycle PWFM system. The system may be expanded to have many more channels. In addition, additional sets of memory, DMA modules and generator modules may be added to a controller to provide more PWFM sequences and be controlled by the same or additional cores.

In FIG. 5, a core 504 is coupled to a memory 506 with multiple tables 520, 522, 524 of PWFM and setting values. Table 520 holds value R for the rise moment and F for the fall moment for the first channel CH1, and table 522 holds values R for the rise moment and F for fall moment for the second channel CH2. The table 524 ("channel 0 or CH0") holds settings, and in particular it holds a common value T for the repetition period, RP for both channels CH1 and CH2. The memory 506 is coupled to a DMA module 508 with multiple memory channels CH1 526, CH2 528 and CH0 530 each having access to one or more of the memory tables using addresses. The DMA module 508 is coupled to multiple registers CH1 532, CH2 534, and control ("CH0") 536 of a generator module 510. The generator module 510 produces pulse sequences that are provided to a coupled peripheral interface PHE 512 for output to a power converter. The peripheral interface PHE 512 may also be referred to may generically as an I/O module. The power converter may be, for example, a two-input power converter such as a multi-channel DC/AC converter, with inputs CH1_out, CH2_out. Alternatively, according to another non-limiting example, it may be a full-bridge convertor requiring four-inputs, CH3_out, CH4_out, in addition to CH1_out and CH2_out. In that example, the third input, CH3_out, to the power converter may be derived from the first input CH1_out. This may be done, for instance, by a module 542 which inverts the CH1_out signal and delays (or accelerates) its rise moments and fall moments to provide a suitable dead-time, for example to allow for slew rates of the switches of the power converter, as will be familiar to the skilled person. Similarly, the fourth input, CH4_out, to the power converter may be derived from the second input CH2_out, for instance, by a module 544 which inverts the CH2_out signal and delays (or accelerates) its rise moments and fall moments. Note that, in embodiments which require such an inverted and/or adjusted signal, this may be done in the controller, as shown at by the invert and dead-time modules 542 and 544, or may be done externally, for instance in the power converter itself.

In operation, the core 504 controls the value or pair of values, set in each of the tables 520, 522, 524. The DMA module 508 enables a channel 526, 528, 530 for each pair of registers that is to be supported by the generator module 510 (or single register in the case of the control channel CH0. The number of channels and the corresponding registers may vary to support different configurations of the generator module. These configurations may be preset, configured in the field, or modified to suit different applications and changes in use. The DMA module 508 receives an initialization or data request from the generator module and then writes the PWM values (that is to say, the rise moment value and fall moment value, into the pair of registers on each channel. In this example, when the CH1 and CH2 pair of registers 532, 534 are initialized with the initial values of the respective tables 520, 522, the generator module will generate a first pulse to the I/O module 512. The pulse provides a feedback DMA trigger signal 540 to one of the channels 526 of the DMA module 508. This causes the DMA module 508 to refresh the registers 532, 534 of both channels, as well as the registers 536 for the control channel CH0. The two channels are synchronized to provide two inputs to the same power converter and the same trigger may be used for both channels.

In some embodiments, the DMA trigger signal 540 from the generator module is applied to one of the DMA channels 526 so that the DMA channel writes the next value from the respective table 520 into the respective generator channel 532. The same DMA trigger 540 reaches all of the DMA channels 528, 530 through the DMA module so that all of the generator channels are updated at the same time. In another embodiment, one generator channel triggers each DMA channel directly. In another embodiment, each generator channel triggers its own DMA channel. In some embodiments, the DMA channels trigger each other. As an example, the first DMA trigger may come from the generator CH0. Then DMA CH0 triggers generator CH0 which triggers DMA CH1 which again triggers generator CH1 and so forth.

In many applications, at least two sequences are needed to drive a single power converter. However, in some cases, only one memory channel is required to generate the two sequences. For example, a half-bridge power converter typically requires one PWFM signal input and a second complementary PWFM signal input. The two pulse sequences can be generated by directly generating the first pulse sequence using a PWFM module in one channel and then the second PWFM sequence can be generated as a complementary signal from the first sequence. Only one table and one memory channel are needed. A full bridge power converter as described above in the context of FIG. 3 requires two unique sequences and two complementary sequences. This can be generated using two sets of tables and two memory channels. In some embodiments the Q3 input is a time delayed version of the Q1 input. The Q3 input can be generated using the same tables and channel but switching the output interface. A three-phase converter requires three sets of tables and memory channels plus the three complementary signals. This provides the six sets of inputs. The configuration of the tables and channels may be configured for other power converters and for more than one power converter.

Figure 6:
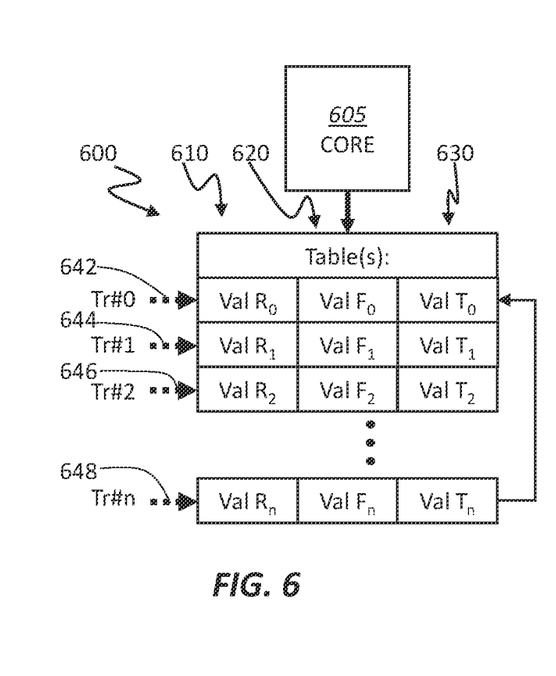
FIG. 6 illustrates an example of a table of PWFM values.

FIG. 6 illustrates a table 600 of PWM pair of values (i.e. the values R and F of the rise and fall moments), together with the repetition rate value T, in memory such as might be used in the embodiments described above. Together the PWM pair of values and the value T may be called the PWFM values. The table has a column 610 of R values R0, R1, R2 . . . . An, a column 620 of F values F0, F1, F2 . . . . Fn, and a third column 630 of repetition period values T0, T1, T2 . . . . Tn. The values in each row are aligned and each row is in a sequential order. The PWM values are accessed in the sequential order in response to a trigger from the generator module to the DWM module to access a row. As an example, in response to the first trigger DMA Tr #0 642, the DMA module reads PWM values R0 and F0 from the table and writes the pair of PWM values into the pair of PWM registers (532 or 534) for a particular channel and the value T0 into the control register 536. In response to the second trigger, DMA Tr #1 644, the DMA module reads the next PWM values in the sequence, R1 and F1, from the table and writes these values into the same pair of PWM registers and reads the next value of T, T1, and writes this value into the control register. This continues through all n rows of the table so that in response to the nth trigger, DMA Trigger #n, the DMA module reads the nth pair of PWM values in the sequence, Rn, and Fn, from the table and writes these values into the same PWM register, and reads the nth value of T, Tn, and writes this value into the control register. After reading all n values in order and reaching the end of the table, a DMA loop trigger is received at the DMA module and the DMA module goes back from the last row in the sequence, row n, to the first row in the sequence, row 0. The DMA module reads the first row from the table to write into the pair of PWM registers and the control resistor. The DMA loop trigger may be an internal DMA signal generated by the DMA module or it may be generated by the generator module.

In the case of a two-channel controller, such as that shown in FIG. 5, each row of the table may be extended with an additional pair of PWM values. The i-th row of the table may then for example include five values, being rise and fall values for the first channel (which may be denoted Rch1_i and Fch1_i), rise and fall values for the second channel (which may be denoted Rch2_i and Fch2_i), and the repetition period value, Ti.

Figure 7:
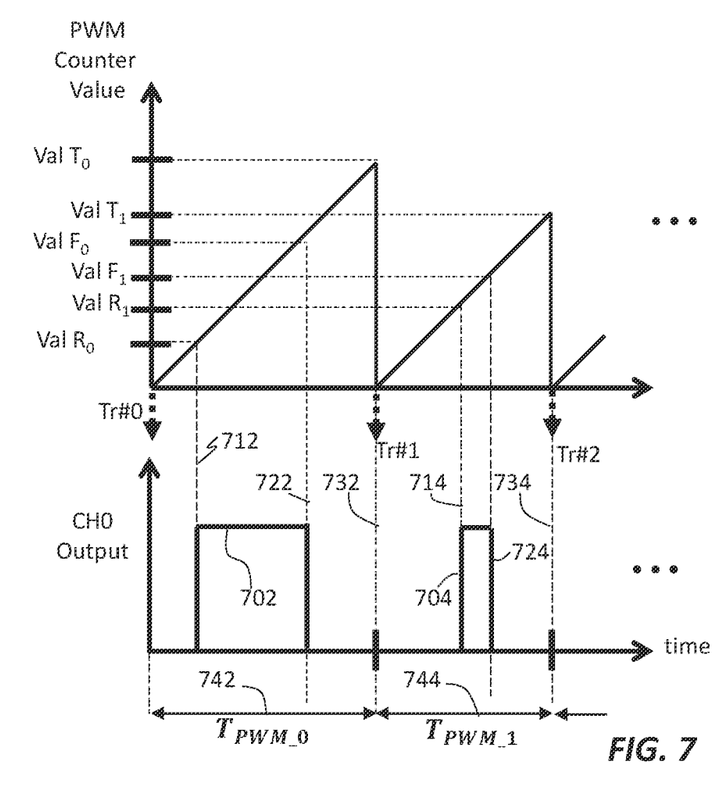
FIG. 7 illustrates defining pulse widths using the table of FIG. 6.

FIG. 7 illustrates an example of how the values provided by the DMA module may be used to define variable width pulses in the PWFM (for a single channel). The top and bottom graphs are aligned on the same time scale with time on the horizontal axis and different triggers aligned on the vertical axis for clarity.

A first of the PWFM values, being a first pair of PWM values R0 and F0, together with a repetition rate value T0, define the pulse width and period of the first period, as shown. In this example R0<F0<T0. The values of R0 and F0 define, according to a counter which is constantly incremented by a local or system clock, the rise moment and fall moment of the pulse. The length of the period is defined by the value T0: when the counter reaches T0, the period (TPWM_0) 742 concludes, and the counter is reset to 0. The counter reaching the value T0 also triggers the DMA trigger tr #1 644, and the next set of values R1, F1 and T1 are loaded into the generator registers. In the example shown in FIG. 7, R1>R0, so next pulse 704 has a later rise moment, that is to say it commences later (within the period) than pulse 702 did within its period. Furthermore F1<F0, so this pulse 704 has an early fall moment, that is to say, it ends earlier (within the period) than pulse 702 did within its period. Due to its latest start and earlier finish the pulse 704 is shorter than that 702. The end of the period is defined by T1: when the counter reaches T1, the period (TPWM_1) 744 concludes, and the counter is again reset to 0. This period (TPWM_1) 744 is shorter than the first period, since T1<T0. The counter reaching the value T1 also triggers the DMA trigger tr #2 646, and the next set of values R2, F2 and T2 are loaded into the generator registers. And so on.

It will be appreciated, that providing independent values for R, F, and T allows for great flexibility of control. In particular both the position (in time) of the pulse within the individual period may be varied, together with the pulse width and the duration of the pulse. The skilled person will appreciate that simple PWM control may be achieved by setting the value of T constant, so it has the same value in each row of the table. Moreover, simple PFM control may be achieved by holding the values of R and F constant, that is to say setting R to have the same value in each row of the table and setting F to have the same value in each row of the table. Simple PFM control may alternatively be achieved by ensuring that the difference between F and R is the same in each row of the table.

The accuracy of the PWFM values may be determined at least in part by the number of bits for the R, F and RP values. Even with 16-bit values, the system has very fine control over the output power from the power converter.

The controller configuration and topology using DMA and PWM modules allow the controller to generate variable duty cycle PWFM signals for many different applications, such as motor controllers, switching power supplies, photovoltaic systems, and even test waveforms. With a single controller, the signal generator is low complexity and allows the controller core to run other applications while also controlling the PWFM output signal. Using the high frequency capability of the topology, power converters with high operating frequencies and high power may be driven such as wireless power transmitters.

In the discussion of FIG. 7 above, it was noted that $Ri < Fi < Ti$. That is to say, within a single period of duration Ti, the rise moment's Ri precedes the fall moment Fi of the pulse. However, in other embodiments different combinations of values may be used. This is illustrated in FIG. 8 which also shows an effect of providing so-called out of range values for one or more of the moments R or F.

Figure 8:
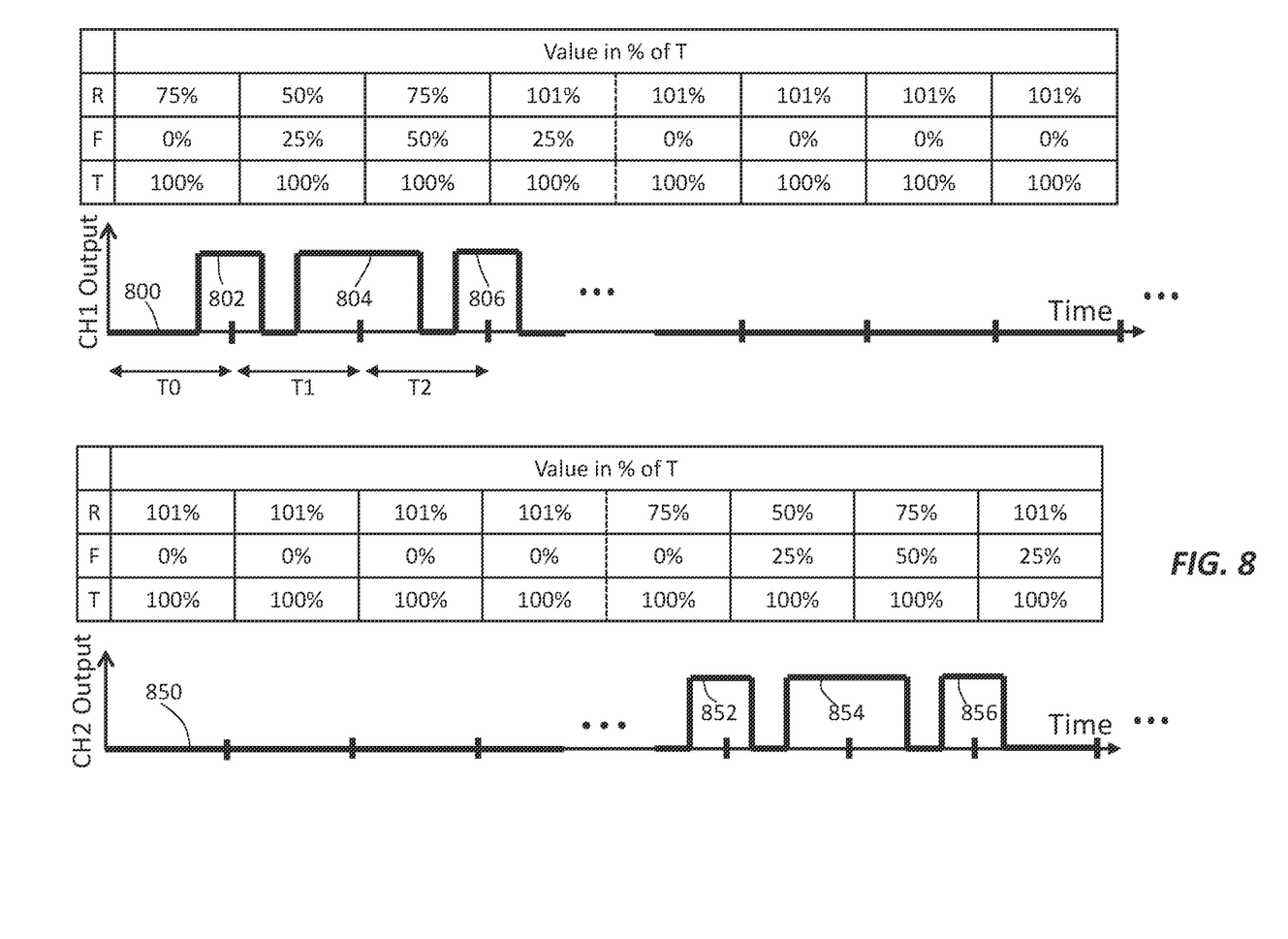
FIG. 8 illustrate relative values of R and F, and for various periods T in the control of a power converter providing bipolar sinusoidal PWM power conversion with pulse ON time longer than the repetition period.

FIG. 8 shows the values of R, F is to say for 2 channels for a power converter providing bipolar sinusoidal PWM output. For ease of understanding in this example the period values of R and F are given relative to the value of T which in each case is denoted 100%. During the fast part of the cycle, channel 1 outputs 800 is modulated by pulses 802, 804 and 806, and channel 2 output 820 is held fixed. Conversely during the second part of the cycle, channel 1 output 800 is held fixed at zero and channel 2 outputs 850 is modulated by pulses 852, 854 and 856.

In this example, pulses cross the end of the period. That is to say the signal is high at the end of the period T. In the first period (defined by T0) there is no fall moment, since the signal is "low" as the start of the period, but the rise moment occurs three quarters of the way through the period, that is the value of R0 is 75% the value of T0. During the second period (T1) the signal falls at a moment which is one quarter through the period (that is to say F1=25%), and then rises at the start of next pulse halfway through the period (that is to say R1=50%). During the third period (T2) the signal falls half-way through the period (i.e. F2=50%) and then rises three-quarters through the period (i.e. R2=75%). And so on, throughout the remainder of the first half-cycle.

During the second half cycle, it is required to hold the output 800 of channel 1 low. This may be done by providing "out of range" values for R and T. For instance, if the value of R is set to be higher than the value of T (as shown it may be 101%) then the period finishes before a rise of the signal is triggered so the signal stay low. Since the signal is low, any value of F may be chosen: in this example it is set to be zero (or 0%), setting F to 0% may be desirable, since this would force the signal to return to a proper "low" in case of an error glitch switching it to high during the preceding period.

The lower half of the figures show the corresponding values of R and F (again relative to T which is set to be 100%) for the output 850 of the second channel. During the first half cycle the output is held low by providing "out of range" values (such as 101% shown) for R, and any value (such as 0% shown) for F. During the second half cycle when pulses 852, 854 and 856 are required appropriate values of R and F are chosen relative to T.

In the example shown in FIG. 8, the signal is held low (and/or forced to return to low after any glitch), by choosing the rise moment R to be out of range and the fall moment F to be zero. The skilled person will appreciate that conversely it is possible to hold the signal high by setting the rise moment R to 0 and the fall moment F to be out of range during the relevant periods.

For the avoidance of doubt, it is confirmed that in FIG. 8 the value of T (that is to say the duration of each PWFM period, may vary in order to provide full flexibility of PWS controlled).

From reading the present disclosure, other variations and modifications will be apparent to the skilled person. Such variations and modifications may involve equivalent and other features which are already known in the art of controllers for power converters and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub-combination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims [delete if not relevant] and reference signs in the claims shall not be construed as limiting the scope of the claims. Furthermore, the word "may" is used in a permissive sense (i.e., meaning having the potential to), rather than the mandatory sense (i.e., meaning must). Similarly, the words "include," "including," and "includes" mean including, but not limited to.

The invention claimed is:

1. A controller for a power converter, the controller comprising:
 a generator module configured to generate a sequence of pulses each having a width that is defined by a rise moment value stored in a rise moment register of the generator module and a fall moment value stored in a fall moment register of the generator module, the sequence of pulses having a repetition rate that is modulated by a repetition period value stored in a repetition period register of the generator module;
 a memory having a table of rise moment values, a table of fall moment values, and a table of repetition period values that are configured to be written into the rise moment register, the fall moment register and the repetition period register, respectively;
 a direct memory access (DMA) module coupled to the generator module and to the memory and configured to write the rise moment values of the table of rise moment values, the fall moment values of the table of fall moment values, and the repetition period values of the table of repetition period values into the rise moment register, the fall moment register and the repetition period register, respectively, in response to a DMA trigger;
 a core coupled to the DMA module and configured to write the rise moment values, the fall moment values, and the repetition period values into the table of rise moment values, the table of fall moment values, and the table of repetition period values, respectively; and an input signal interface coupled to the core and configured to receive an input signal, wherein the core is configured to modify the rise moment, fall moment, and repetition period values in response to the input signal and to write the modified rise moment, fall moment, and repetition period values into the memory.

2. The controller of claim 1, wherein the generator module is configured to send the DMA trigger to the DMA module after generating each pulse.

3. The controller of claim 2, wherein the table of repetition period values has a sequentially ordered plurality of repetition period values, and wherein the DMA module is configured to write the repetition period values from the table of repetition period values into the repetition period register in the sequential order in response to each DMA trigger.

4. The controller of claim 3, wherein the DMA module is configured to write a first repetition period value of the sequentially ordered plurality of repetition period values after writing a last repetition period value of the sequentially ordered plurality of repetition period values.

5. The controller of claim 1, wherein the generator module is configured to generate at least two different sequences of pulses to drive two inputs of the power converter.

6. The controller of claim 1, wherein the core is configured to modify the rise moment, fall moment, and repetition period values by selecting a stored set of different rise moment, fall moment, and repetition period values in response to the input signal.

7. The controller of claim 1, wherein the core is configured to modify the rise moment, fall moment, and repetition period values by incrementing or decrementing at least one value of the rise moment, fall moment, and repetition period values in response to the input signal.

8. The controller of claim 1, wherein the input signal is provided by a closed feedback loop from a power output of the power converter.

9. The controller of claim 1, wherein the input signal is a power output command from an external component.

10. A method of controlling a power converter, the method comprising:

generating, in a generator module, a sequence of pulses each having a width that is defined by a rise moment value stored in a rise moment register of the generator module and a fall moment value stored in a fall moment register of the generator module, the sequence of pulses having a repetition rate that is modulated by a repetition period value stored in a repetition period register of the generator module;

writing, from a memory having a table of rise moment values, a table of fall moment values and a table of repetition period values, the rise moment values, the fall moment values and the repetition period values into the rise moment register, the fall moment register and the repetition period register, respectively; and writing, by a direct memory access (DMA) module coupled to the generator module and to the memory, the rise moment values of the table of rise moment values, the fall moment values of the table of fall moment values, and the repetition period values of the table of repetition period values into the rise moment register, the fall moment register and the repetition period register, respectively, in response to a DMA trigger, the method further comprising:

writing, from a core coupled to the DMA module, the rise moment values, the fall moment values, and the repetition period values into the table of rise moment values, the table of fall moment values, and the table of repetition period values, respectively; and receiving an input signal, wherein the core is configured to modify the rise moment, fall moment, and repetition period values in response to the input signal and to write the modified rise moment, fall moment, and repetition period values into the memory.

11. The method of claim 10, wherein the generator module sends the DMA trigger to the DMA module after generating each pulse.

12. The method of claim 11, wherein the table of repetition period values has a sequentially ordered plurality of repetition period values, and wherein the DMA module writes the repetition period values from the table of repetition period values into the repetition period register in the sequential order in response to each DMA trigger.

13. The method of claim 12, wherein the DMA module writes a first repetition period value of the sequentially ordered plurality of repetition period values after writing a last repetition period value of the sequentially ordered plurality of repetition period values.

14. The method of claim 10, wherein the core modifies the rise moment, fall moment, and repetition period values by selecting a stored set of different rise moment, fall moment, and repetition period values in response to the input signal.

15. The method of claim 10, wherein the core modifies the rise moment, fall moment, and repetition period values by incrementing or decrementing at least one value of the rise moment, fall moment, and repetition period values in response to the input signal.

16. The method of claim 10, wherein the input signal is provided by a closed feedback loop from a power output of the power converter.

* * * * *